(12) United States Patent
Kushida et al.

(10) Patent No.: US 7,710,808 B2
(45) Date of Patent: May 4, 2010

(54) SEMICONDUCTOR MEMORY DEVICE INCLUDING A STATIC MEMORY CELL

(75) Inventors: Keiichi Kushida, Kawasaki (JP); Nobuaki Otsuka, Komae (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 156 days.

(21) Appl. No.: 12/015,244

(22) Filed: Jan. 16, 2008

(65) Prior Publication Data

US 2008/0175040 A1 Jul. 24, 2008

(30) Foreign Application Priority Data

Jan. 18, 2007 (JP) ............................. 2007-009397

(51) Int. Cl.
*G11C 7/02* (2006.01)
(52) U.S. Cl. ...................... 365/210; 365/200; 365/201; 365/230.03
(58) Field of Classification Search ................. 365/200, 365/201, 210.1, 230.03, 210
See application file for complete search history.

(56) References Cited

U.S. PATENT DOCUMENTS 6,687,171 B2 * 2/2004 Rehm et al. ................. 365/200
6,822,477 B1 * 11/2004 Bingert et al. ................ 326/41
6,870,780 B2 * 3/2005 Park et al. .................... 365/200
2003/0179643 A1 * 9/2003 Winograd et al. ............ 365/233

FOREIGN PATENT DOCUMENTS

JP 2004-71118 3/2004
JP 2006-4476 1/2006

* cited by examiner

*Primary Examiner*—Connie C Yoha
(74) *Attorney, Agent, or Firm*—Oblon, Spivak, McClelland, Maier & Neustadt, L.L.P.

(57) ABSTRACT

A semiconductor memory device includes a first block and a second block adjacent to each other in a column direction, each block including first and second memory cell arrays each including a plurality of local bit lines and a local sense amplifier shared by the first and second memory cell arrays, a plurality of global bit lines shared by the first block and the second block, a global sense amplifier configured to sense data transferred to the global bit lines, first and second replica cell groups provided in the first and second blocks, first and second replica bit lines connected to the first and second replica cell groups, an activation circuit connected to each replica bit line, and configured to activate the local sense amplifier, an edge cell group surrounding the first block and the second block, and a contact region surrounding the edge cell group.

21 Claims, 6 Drawing Sheets

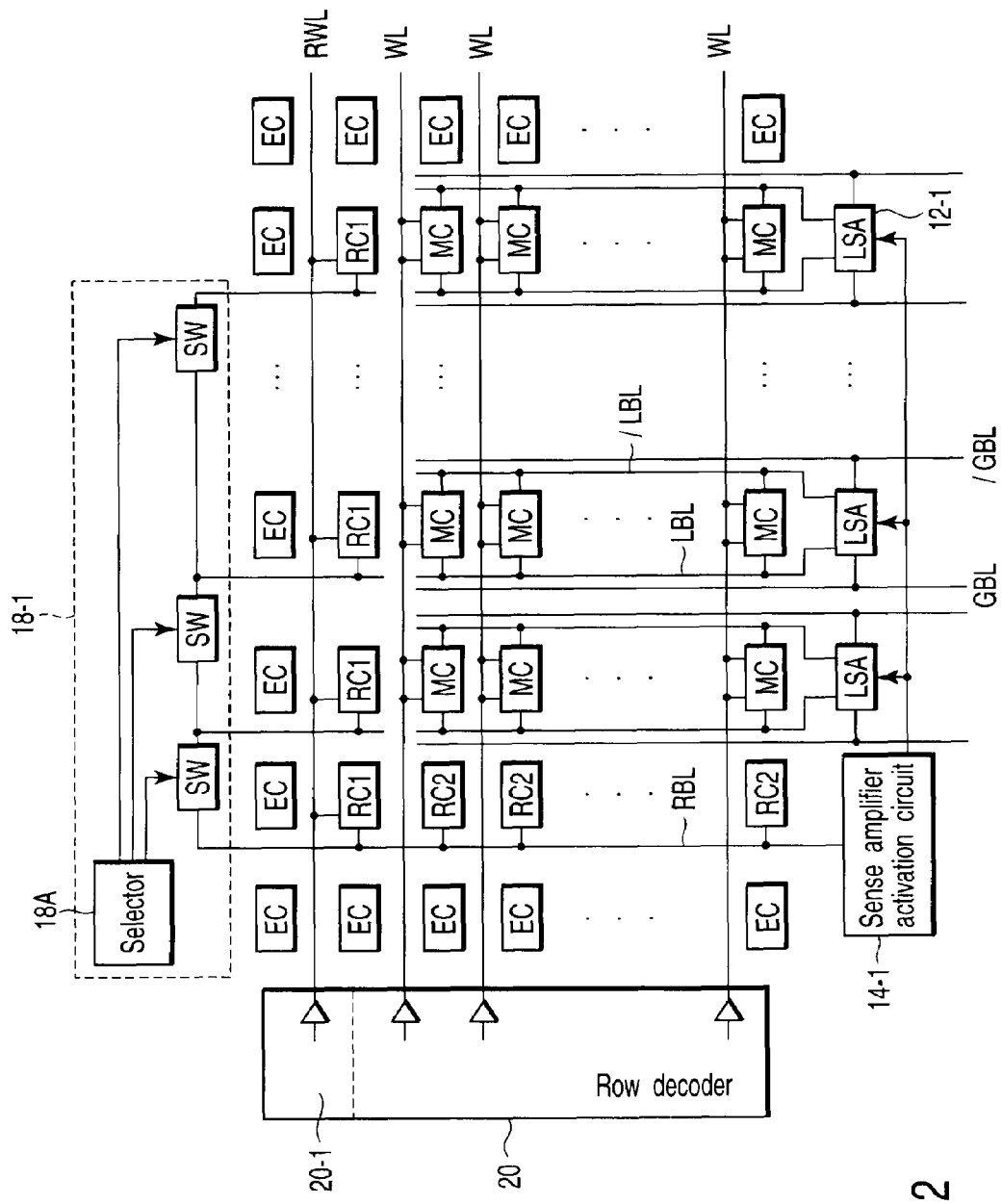
F I G. 2

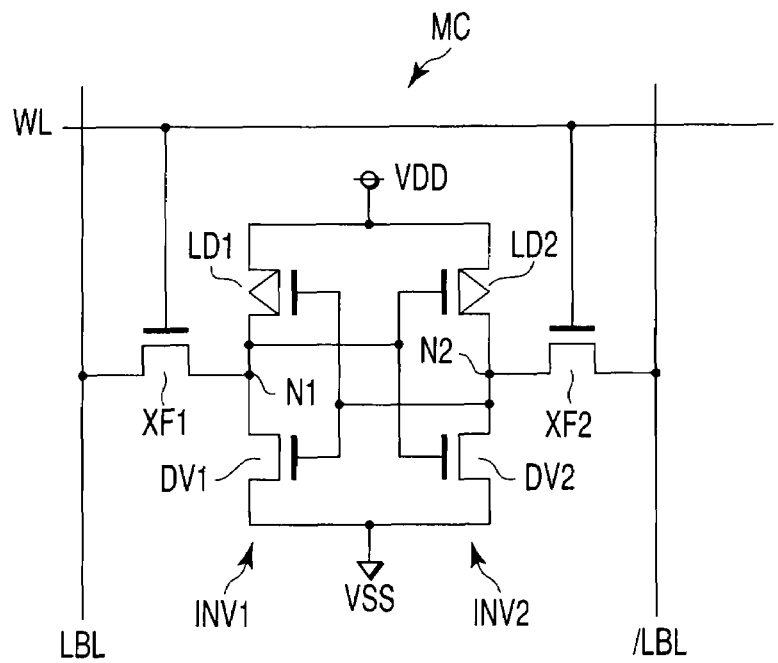
F I G. 3
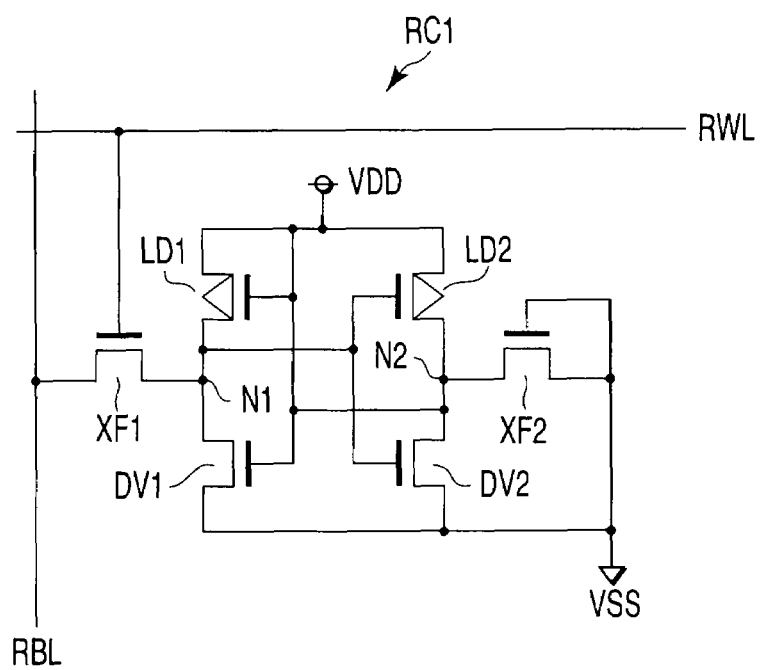
F I G. 4

US 7,710,808 B2

SEMICONDUCTOR MEMORY DEVICE INCLUDING A STATIC MEMORY CELL

CROSS-REFERENCE TO RELATED APPLICATIONS

This application is based upon and claims the benefit of priority from prior Japanese Patent Application No. 2007-009397, filed Jan. 18, 2007, the entire contents of which are incorporated herein by reference.

BACKGROUND OF THE INVENTION

1. Field of the Invention

The present invention relates to a semiconductor memory device, e.g., a semiconductor memory device including a static memory cell.

2. Description of the Related Art

Recently, a static random access memory (SRAM) using the hierarchical bit line method is beginning to be used as the degree of micropatterning and the operating speed of SRAMs increase. This SRAM using the hierarchical bit line method comprises a plurality of memory cell arrays, a local sense amplifier for reading data from each memory cell array, and a global sense amplifier for inputting data to and receiving data from each local sense amplifier.

That is, a plurality of local bit lines whose bit line capacitance is reduced by finely dividing a bit line are connected to a plurality of local sense amplifiers. Each local sense amplifier amplifies data and sends the amplified data to a global bit line, and a global sense amplifier connected to the global bit line decides the data. In this manner, data is read from a memory cell by the two stages of bit lines/sense amplifiers. The cell current can be reduced because the capacitance of each bit line can be reduced by thus hierarchizing the bit lines.

A memory cell array placed on the far side of the local sense amplifier from the global sense amplifier has a replica cell for controlling the activation timing of the local sense amplifier. That is, a line delay equal to that occurring when accessing a memory cell farthest from the global sense amplifier is reproduced using the replica cell, and the local sense amplifier is controlled using the timing of a signal generated by this replica cell.

Note that as a related technique of this kind, a technique that readily optimizes the operation timing in a static semiconductor memory device using a dummy memory cell is disclosed (Jpn. Pat. Appln. KOKAI Publication No. 2004-71118).

BRIEF SUMMARY OF THE INVENTION

According to a first aspect of the present invention, there is provided a semiconductor memory device comprising:

a first block and a second block adjacent to each other in a column direction, each block including a first memory cell array and a second memory cell array adjacent to each other in the column direction, and each including a plurality of memory cells arranged in a matrix, a plurality of local bit lines provided in each memory cell array, and configured to select a column of the memory cell array, and a local sense amplifier shared by the first memory cell array and the second memory cell array, and configured to sense data transferred from a memory cell to a local bit line;

a plurality of global bit lines shared by the first block and the second block, and configured to receive data transferred from the local sense amplifier;

a global sense amplifier adjacent to the second block in the column direction, and configured to sense data transferred to the global bit lines;

a first replica cell group and a second replica cell group respectively provided in the first block and the second block, and each including a plurality of replica cells;

a first replica bit line and a second replica bit line respectively connected to the first replica cell group and the second replica cell group;

an activation circuit connected to each replica bit line, and configured to activate the local sense amplifier on the basis of a potential of the replica bit line;

an edge cell group surrounding the first block and the second block, and configured to store no data; and a contact region surrounding the edge cell group, and having contacts which supply power to a well region of transistors forming the memory cells.

According to a second aspect of the present invention, there is provided a semiconductor memory device comprising:

a first block and a second block adjacent to each other in a column direction, each block including a first memory cell array and a second memory cell array adjacent to each other in the column direction, and each including a plurality of memory cells arranged in a matrix, a plurality of local bit lines provided in each memory cell array, and configured to select a column of the memory cell array, and a local sense amplifier shared by the first memory cell array and the second memory cell array, and configured to sense data transferred from a memory cell to a local bit line;

a plurality of global bit lines shared by the first block and the second block, and configured to receive data transferred from the local sense amplifier;

a global sense amplifier adjacent to the second block in the column direction, and configured to sense data transferred to the global bit lines;

a first replica cell group and a second replica cell group respectively provided in the first block and the second block, and each including a plurality of replica cells;

a first replica bit line and a second replica bit line respectively connected to the first replica cell group and the second replica cell group;

an activation circuit connected to each replica bit line, and configured to activate the local sense amplifier on the basis of a potential of the replica bit line; and a replica controller shared by the first replica cell group and the second replica cell group, and configured to control the number of replica cells to be connected to the replica bit line.

BRIEF DESCRIPTION OF THE SEVERAL VIEWS OF THE DRAWING

FIG. 2 is a block diagram illustrating the arrangement of a memory cell array 11-1 and its peripheral portion;

FIG. 3 is a circuit diagram illustrating the arrangement of a memory cell MC shown in FIG. 2;

FIG. 4 is a circuit diagram illustrating the arrangement of a replica cell RC1 shown in FIG. 2;

DETAILED DESCRIPTION OF THE INVENTION

Figure 1:
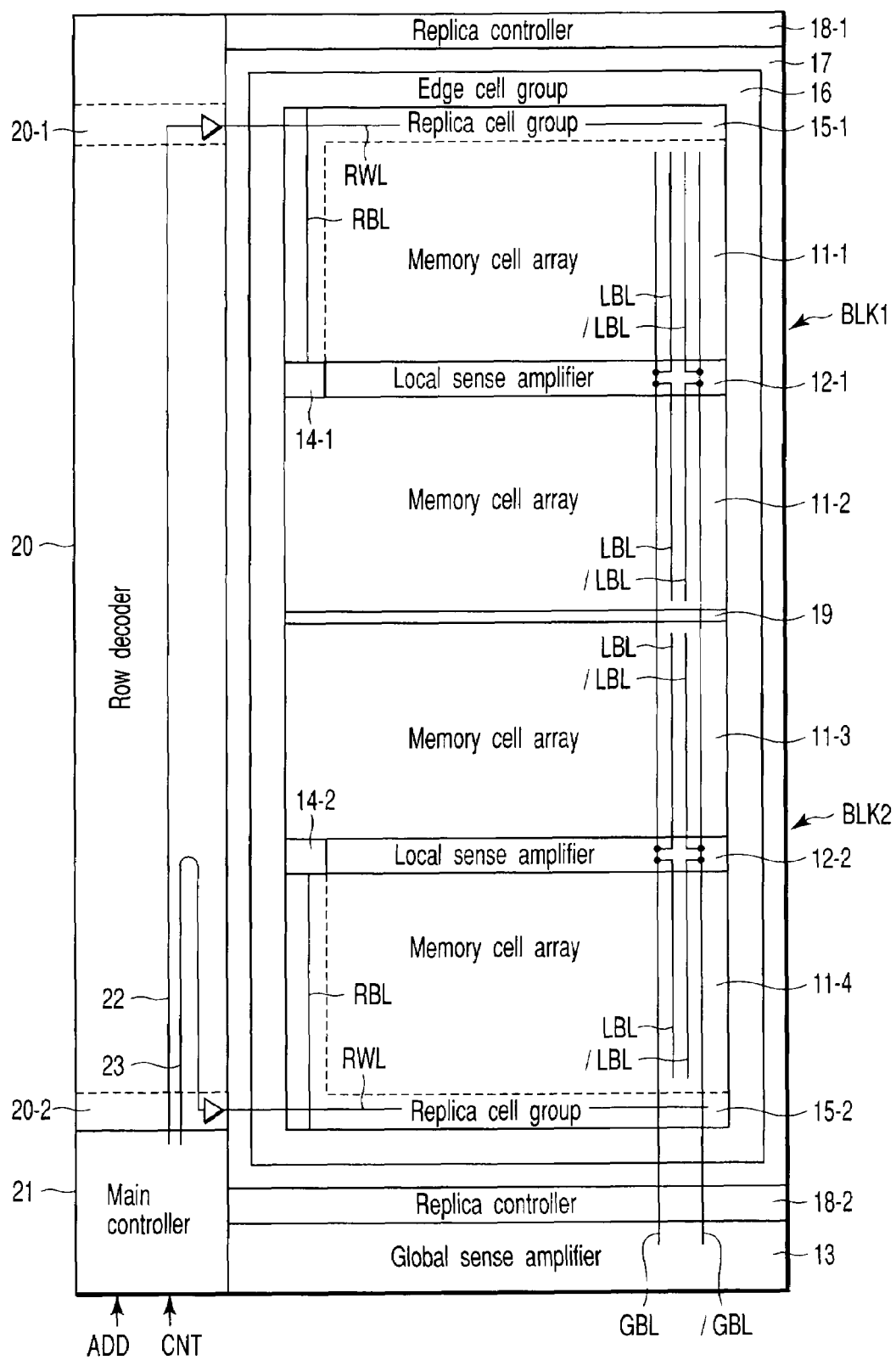
FIG. 1 is a block diagram illustrating the arrangement of an SRAM according to the first embodiment of the present invention.

Embodiments of the present invention will be explained below with reference to the accompanying drawing. Note that in the following explanation, the same reference numerals denote elements having the same functions and arrangements, and a repetitive explanation will be made only when necessary.

First Embodiment

FIG. 1 is a block diagram illustrating the arrangement of an SRAM according to the first embodiment of the present invention. The SRAM comprises a plurality of memory cell arrays. For example, this embodiment shows four memory cell arrays 11-1 to 11-4 arranged adjacent to each other in the column direction. In each memory cell array, a plurality of static memory cells MC are arranged in a matrix.

The SRAM of this embodiment has a hierarchical bit line structure. This embodiment is an example of the arrangement of an SRAM in which a global bit line GBL and a local bit line LBL connected to the global bit line GBL have a "1:1" relationship in each memory cell array. However, the present invention is also applicable to an SRAM in which a global bit line GBL and local bit lines LBL connected to the global bit line GBL have a "1:n (n is an integer of 2 or more)" relationship in each memory cell array.

The four memory cell arrays 11-1 to 11-4 have a plurality of pairs of global bit line GBL and /GBL running in the column direction, so as to share these global bit line pairs. Each memory cell array has a plurality of pairs of local bit lines LBL and /LBL corresponding to the pairs of global bit lines GBL and /GBL. The pairs of local bit lines LBL and /LBL formed in the memory cell arrays 11-1 and 11-2 are connected to the pairs of global bit lines GBL and /GBL via a local sense amplifier 12-1. The pairs of local bit lines LBL and /LBL formed in the memory cell arrays 11-3 and 11-4 are connected to the pairs of global bit lines GBL and /GBL via a local sense amplifier 12-2. The local sense amplifiers 12-1 and 12-2 sense and amplify data transferred from the memory cells MC to the pairs of local bit lines LBL and /LBL.

The local sense amplifier 12-1 is placed between the memory cell arrays 11-1 and 11-2. The local sense amplifier 12-1 is shared by the memory cell arrays 11-1 and 11-2, and senses and amplifies data of the memory cell arrays 11-1 and 11-2. The local sense amplifier 12-2 is placed between the memory cell arrays 11-3 and 11-4. The local sense amplifier 12-2 is shared by the memory cell arrays 11-3 and 11-4, and senses and amplifies data of the memory cell arrays 11-3 and 11-4.

The memory cell arrays 11-1 and 11-2 and the local sense amplifier 12-1 shared by these memory cell arrays form a first block BLK1. The memory cell arrays 11-3 and 11-4 and the local sense amplifier 12-2 shared by these memory cell arrays form a second block BLK2.

A local bit line separation region 19 is formed between the memory cell arrays 11-2 and 11-3. The local bit line separation region 19 electrically separates the local bit lines in the memory cell array 11-2 from the local bit lines in the memory cell array 11-3. Even when the memory cell arrays 11-2 and 11-3 are arranged adjacent to each other, the local bit line separation region 19 can electrically separate the local bit lines in these memory cell arrays. Note that the length in the column direction of the local bit line separation region 19 is set smaller than that in the column direction of one memory cell. Note also that it is not particularly necessary to form the local bit line separation region 19 if the local bit lines in the memory cell arrays 11-2 and 11-3 can be electrically separated without forming the local bit line separation region 19.

A global sense amplifier 13 is connected to one end of each of the global bit lines GBL and /GBL. The global sense amplifier 13 senses and amplifies data of each pair of global bit lines GBL and /GBL.

Word lines WL running in the row direction are formed in the four memory cell arrays 11-1 to 11-4. A row decoder 20 is connected to the word lines WL. The row decoder 20 decodes a pre-decode signal supplied from a main controller 21, and selects a corresponding one of the word lines WL.

The main controller 21 controls each circuit in the SRAM. The main circuit 21 receives an address signal ADD, control signal CNT, and the like from an external circuit. The main controller 21 decodes the address signal ADD, and supplies the pre-decoded signal to the row decoder 20. Also, the main controller 21 controls a write operation, read operation, and the like on the basis of the control signal CNT.

An edge cell group 16 including edge cells EC is formed around the first and second blocks BLK1 and BLK2. When processing a memory cell array, cells formed at the ends of the memory cell array have large variations in layout and characteristics caused by the processing. Therefore, these cells arranged at the ends of the cell array are not used as memory cells MC and replica cells. These cells arranged at the ends of the memory cell array are the edge cells EC. The edge cells EC store no data.

A well contact region 17 is formed around the edge cell group 16. Each of the memory cells MC and replica cells comprises MOS transistors. These MOS transistors are formed in a semiconductor region (well) formed in a substrate. The well contact region 17 is a region where contacts that supply power to the well are formed. In this embodiment, the well contact region 17 is formed to surround the cell arrays, and many contacts (not shown) are formed in the well contact region 17. Since the potential of the well can be made even, the characteristics of the MOS transistors forming the memory cell can improve.

The memory cell array 11-1 has a replica cell group 15-1 for activating the local sense amplifier 12-1. The memory cell array 11-4 has a replica cell group 15-2 for activating the local sense amplifier 12-2. The replica cell groups 15-1 and 15-2 each comprise a row of replica cells RC1 and a column of replica cells RC2.

To increase the operating speed of the SRAM, it is desirable to make the activation timings of the local sense amplifiers 12-1 and 12-2 as early as possible. If the activation timings are too early, however, the input potential difference supplied from the local bit line pair to the local sense amplifier becomes insufficient, and the SRAM causes an operation error. To achieve a high-speed operation, therefore, it is important to set optimum activation timings of the local sense amplifiers 12-1 and 12-2. The replica cell groups 15-1 and 15-2 are formed to set the activation timings of the local sense amplifiers 12-1 and 12-2.

Referring to FIG. 1, a replica controller 18-1 is formed above the replica cell group 15-1 to sandwich the edge cells EC and well contact region 17. A replica controller 18-2 is formed below the replica cell group 15-2 to sandwich the edge cells EC and well contact region 17. The replica controllers 18-1 and 18-2 each control the number of the replica cells RC1 to be connected to a replica bit line RBL.

FIG. 2 is a block diagram illustrating the arrangement of the memory cell array 11-1 and its peripheral portion. Note that the arrangement of the memory cell array 11-4 and its peripheral portion (the local sense amplifier 12-2, a sense amplifier activation circuit 14-2, the replica cell group 15-2, and the replica controller 18-2) is obtained by turning the layout shown in FIG. 2 upside down.

The memory cell array 11-1 has the word lines WL and the pairs of local bit lines LBL and/LBL. The memory cells MC are arranged at the intersections of the word lines WL and the pairs of local bit lines LBL and/LBL. Each pair of local bit lines LBL and/LBL are connected to a corresponding one of the pairs of global bit lines GBL and/GBL via the local sense amplifier (LSA) 12-1.

A replica word line RWL is formed outside the word line WL farthest from the local sense amplifier 12-1. The replica bit line RBL is formed between the row decoder 20 and the pairs of local bit lines LBL and/LBL. Replica cells are connected to the replica word line RWL and replica bit line RBL. The edge cells EC are arranged at the ends of the cell array.

The replica controller 18-1 controls the number of the replica cells RC1 to be connected to the replica bit line RBL, among the replica cells RC1 in the row direction (i.e., the replica cells connected to the replica word line RWL). The replica controller 18-1 comprises switching elements SW corresponding to the replica cells RC1 in the row direction, and a selector 18A for controlling the turning on/off of the switching elements SW. When the selector 18A turns on an arbitrary number of switching elements SW, the replica cells RC1 connected to the switching elements SW are connected to the replica bit line RBL.

A sense amplifier activation circuit 14-1 controls the activation timing of the local sense amplifier (LSA) 12-1. The sense amplifier activation circuit 14-1 is connected to the replica bit line RBL. The sense amplifier activation circuit 14-1 activates the local sense amplifier 12-1 when the replica bit line RBL changes to low level. After being activated by the sense amplifier activation circuit 14-1, therefore, the local sense amplifier 12-1 senses and amplifies data of the local bit lines LBL and/LBL.

The row decoder 20 has a replica row decoder 20-1 for decoding the replica word line RWL. The replica row decoder 20-1 selects the replica word line RWL on the basis of a replica control signal supplied from the main controller 21. The row decoder 20 also has a replica row decoder 20-2 for selecting the replica word line RWL formed in the replica cell group 15-2.

Note that although not shown, a precharge circuit is connected to the local bit lines, replica bit lines, and global bit lines. Before the execution of read and write operations, this precharge circuit precharges the local bit lines, replica bit lines, and global bit lines to a high-level voltage (e.g., a power supply voltage VDD).

FIG. 3 is a circuit diagram illustrating the arrangement of the memory cell MC shown in FIG. 2. The memory cell MC is a 6Tr. type SRAM cell including six MOS transistors.

The memory cell MC comprises first and second inverter circuits INV1 and INV2. The first inverter circuit INV1 comprises a P-channel MOS (PMOS) transistor LD1 as a load, and an N-channel MOS (NMOS) transistor DV1 for driving. The PMOS transistor LD1 and NMOS transistor DV1 are connected in series between a power supply terminal to which the power supply voltage VDD is applied, and a ground terminal to which a ground voltage VSS is applied.

The second inverter circuit INV2 comprises a PMOS transistor LD2 as a load and an NMOS transistor DV2 for driving. The PMOS transistor LD2 and NMOS transistor DV2 are connected in series between the power supply terminal and ground terminal.

More specifically, the source terminal of the PMOS transistor LD1 is connected to the power supply terminal. The drain terminal of the PMOS transistor LD1 is connected to the drain terminal of the NMOS transistor DV1 via a storage node N1. The gate terminal of the PMOS transistor LD1 is connected to the gate terminal of the NMOS transistor DV1. The source terminal of the NMOS transistor DV1 is connected to the ground terminal.

The source terminal of the PMOS transistor LD2 is connected to the power supply terminal. The drain terminal of the PMOS transistor LD2 is connected to the drain terminal of the NMOS transistor DV2 via a storage node N2. The gate terminal of the PMOS transistor LD2 is connected to the gate terminal of the NMOS transistor DV2. The source terminal of the NMOS transistor DV2 is connected to the ground terminal.

The gate terminal of the PMOS transistor LD1 is connected to the storage node N2. The gate terminal of the PMOS transistor LD2 is connected to the storage node N1. In other words, the output terminal of the first inverter circuit INV1 is connected to the input terminal of the second inverter circuit INV2, and the output terminal of the second inverter circuit INV2 is connected to the input terminal of the first inverter circuit INV1.

The storage node N1 is connected to the local bit line LBL via a transfer gate XF1 that is an NMOS transistor. The storage node N2 is connected to the local bit line/LBL via a transfer gate XF2 that is an NMOS transistor. The gate terminals of the transfer gates XF1 and XF2 are connected to the word line WL.

FIG. 4 is a circuit diagram illustrating the arrangement of the replica cell RC1 shown in FIG. 2. The replica cell RC1 basically has the same arrangement as that of the memory cell MC. The differences from the memory cell MC will be mainly explained below.

The gate terminals of an NMOS transistor DV1 for driving and a PMOS transistor LD1 as a load are connected to a power supply terminal. Accordingly, the PMOS transistor LD1 is normally off, and the NMOS transistor DV1 is normally on. That is, the flip-flop operation of the replica cell RC is fixed. Data "0" is stored in a storage node N1 of the replica cell RC1. Data "1" is stored in a storage node N2 of the replica cell RC1.

The storage node N1 is connected to the replica bit line RBL via a transfer gate XF1. The gate terminal of the transfer gate XF1 is connected to the replica word line RWL. The gate terminal and source terminal of a transfer gate XF2 are grounded. Therefore, the transfer gate XF2 is normally off.

Figure 5:
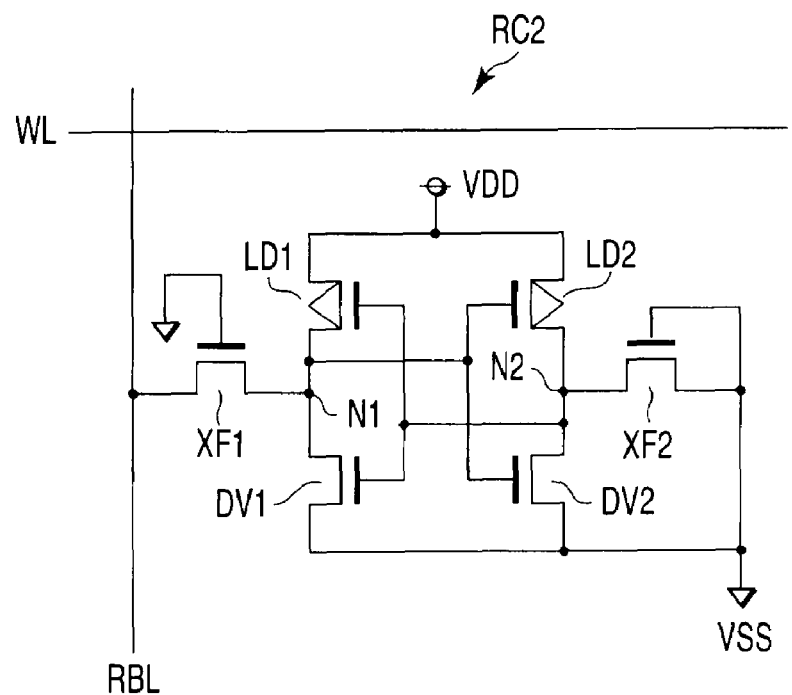
FIG. 5 is a circuit diagram illustrating the arrangement of a replica cell RC2 shown in FIG. 2.

FIG. 5 is a circuit diagram illustrating the arrangement of the replica cell RC2 shown in FIG. 2. The replica cell RC2 also basically has the same arrangement as that of the memory cell MC. A storage node N1 is connected to the replica bit line RBL via a transfer gate XF1. The gate terminal of the transfer gate XF1 is grounded. Accordingly, the transfer gate XF1 is normally off. Even when the word line WL corresponding to an arbitrary replica cell RC2 is selected, therefore, the replica cell RC2 transfers no data to the replica bit line RBL. Also, the gate terminal and source terminal of a transfer gate XF2 are grounded. Accordingly, the transfer gate XF2 is normally off.

Figure 6:
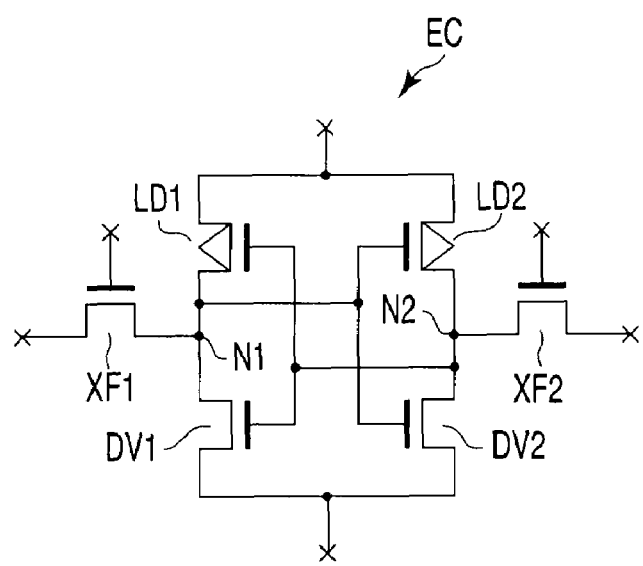
FIG. 6 is a circuit diagram illustrating the arrangement of an edge cell EC shown in FIG. 2.

FIG. 6 is a circuit diagram illustrating the arrangement of the edge cell EC shown in FIG. 2. The gate terminals of transfer gates XF1 and XF2 of the edge cell CE are electrically insulated (or grounded). The source terminals of NMOS transistors DV1 and DV2 for driving are electrically insulated, and the source terminals of PMOS transistors LD1 and LD2 as loads are electrically insulated. Therefore, the edge cell EC stores no data.

The operation of the SRAM configured as above will be explained below. The replica word line RWL of the replica cell group 15-1 is selected (activated) at the same time an arbitrary memory cell MC in the memory cell arrays 11-1 and 11-2 is selected. Consequently, the replica cells RC1 corresponding to a number selected by the replica controller 18-1 are connected to the replica bit line RBL.

In this case, the row decoder 20-1 selects the replica word line RWL on the basis of a replica control signal from the main controller 21. This replica control signal is supplied through a signal line 22 (FIG. 1) having a length corresponding to the distance from the main controller 21 to the replica word line RWL.

Similarly, the replica word line RWL of the replica cell group 15-2 is selected (activated) at the same time an arbitrary memory cell MC in the memory cell arrays 11-3 and 11-4 is selected. Consequently, the replica cells RC1 corresponding to a number selected by the replica controller 18-2 are connected to the replica bit line RBL of the replica cell group 15-2.

In this case, the row decoder 20-2 selects the replica word line RWL of the replica cell group 15-2 on the basis of a replica control signal from the main controller 21. This replica control signal is supplied through a signal line 23 (FIG. 1).

The signal line 23 runs from the main controller 21 to the local sense amplifier 12-2, and returns near the local sense amplifier 12-2 to reach the replica word line RWL. That is, the length of the signal line 23 is equal to the distance from the main controller 21 to that end of the memory cell array 11-3, which is far from the local sense amplifier 12-2. This makes it possible to reproduce, during a read operation, the delay that occurs in the memory cell MC farthest from the local sense amplifier 12-2 and includes the delay of the replica control signal.

In this embodiment as has been explained in detail above, the replica cell group 15-1 of the local sense amplifier 12-1 is formed in the memory cell array 11-1 above the local sense amplifier 12-1, and the replica cell group 15-2 of the local sense amplifier 12-2 is formed in the memory cell array 11-4 below the local sense amplifier 12-2. Accordingly, the replica controller 18-1 of the replica cell group 15-1 is formed above the memory cell array 11-1, and the replica controller 18-2 of the replica cell group 15-2 is formed below the memory cell array 11-4.

Consequently, the edge cells EC and well contact region 17 that are required because the replica controller is formed between the memory cell arrays need not be formed between the memory cell arrays 11-2 and 11-3. This makes it possible to reduce the area of the SRAM. More specifically, compared to an SRAM having the conventional hierarchical structure, the length in the column direction of the SRAM can be decreased by two rows of the edge cells EC and two rows of the well contact region.

Also, a line delay produced when reading data from the memory cell MC farthest from the local sense amplifier can be reproduced by using the replica cells RC1. This makes it possible to suppress the influence of the line delay and the variation in power supply voltage, and optimally control the activation timings of the local sense amplifiers 12-1 and 12-2. As a consequence, the read cycle time can be shortened.

Furthermore, the SRAM comprises the replica controllers 18-1 and 18-2 for controlling the number of the replica cells RC1 to be connected to the replica bit line RBL. Accordingly, it is possible to adjust a delay when the potential of the replica bit line RBL changes to low level.

Second Embodiment

The second embodiment reduces the area of an SRAM by allowing adjacent memory cell arrays to share a replica controller.

Figure 7:
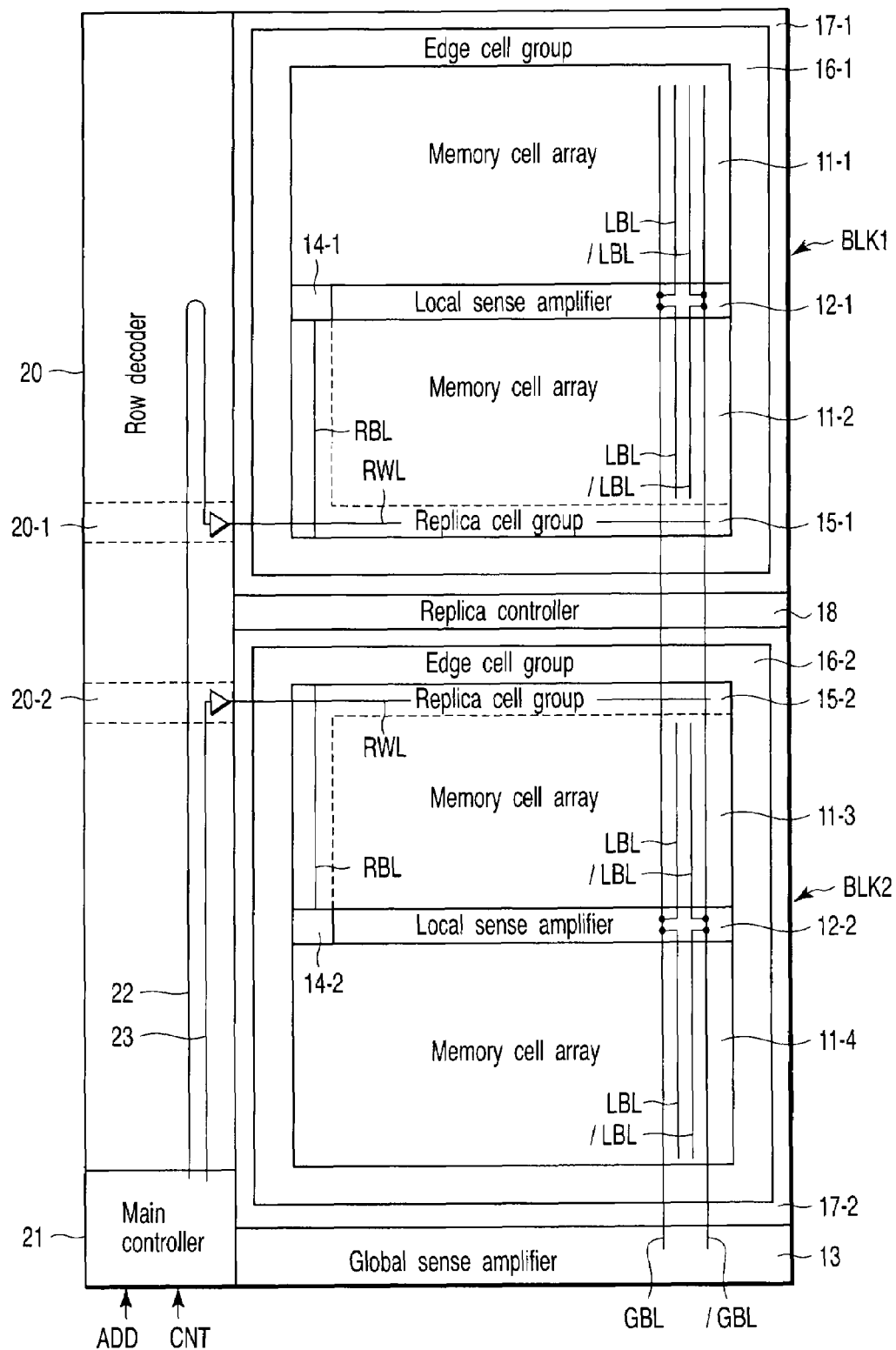
FIG. 7 is a block diagram illustrating the arrangement of an SRAM according to the second embodiment of the present invention.

FIG. 7 is a block diagram illustrating the arrangement of the SRAM according to the second embodiment of the present invention. Memory cell arrays 11-1 and 11-2 and a local sense amplifier 12-1 shared by these memory cell arrays form a first block BLK1. Also, memory cell arrays 11-3 and 11-4 and a local sense amplifier 12-2 shared by these memory cell arrays form a second block BLK2.

An edge cell group 16-1 is formed around the first block BLK1 so as to surround it. A well contact region 17-1 is formed around the edge cell group 16-1 so as to surround it.

An edge cell group 16-2 is formed around the second block BLK2 so as to surround it. A well contact region 17-2 is formed around the edge cell group 16-2 so as to surround it. The arrangement of the edge cell groups 16-1 and 16-2 is the same as that of the edge cell group 16 described in the first embodiment. The arrangement of the well contact regions 17-1 and 17-2 is the same as that of the well contact region 17 described in the first embodiment.

The memory cell array 11-2 has a replica cell group 15-1. The replica cell group 15-1 comprises replica cells RC1 in the row direction, and replica cells RC2 in the column direction. The replica cells RC1 included in the replica cell group 15-1 are connected to a replica word line RWL formed outside a word line WL farthest from the local sense amplifier 12-1.

The memory cell array 11-3 has a replica cell group 15-2. The replica cell group 15-2 comprises replica cells RC1 in the row direction, and replica cells RC2 in the column direction. The replica cells RC1 included in the replica cell group 15-2 are connected to a replica word line RWL formed outside a word line WL farthest from the local sense amplifier 12-2.

A replica controller 18 is formed between the first and second blocks BLK1 and BLK2. The replica cell groups 15-1 and 15-2 share the replica controller 18. The replica controller 18 controls the number of the replica cells RC1 to be connected to a replica bit line RBL in each of the replica cell groups 15-1 and 15-2. More specifically, the replica controller 18 comprises a selector 18A, and switching elements SW corresponding to the replica cell groups 15-1 and 15-2.

A signal line 23 for selecting the replica word line RWL of the replica cell group 15-1 runs from a main controller 21 to a replica row decoder 20-2 as in the conventional arrangement. On the other hand, a signal line 22 for selecting the replica word line RWL of the replica cell group 15-2 runs from the main controller 21 to the local sense amplifier 12-1, and returns from the local sense amplifier 12-1 to reach the replica word line RWL.

In the SRAM configured as above, the replica cell groups 15-1 and 15-2 can share one replica controller although the conventional SRAM requires two replica controllers. That is, one replica controller can be reduced.

Also, compared to an SRAM having the conventional hierarchical structure, the length in the column direction of the SRAM can be decreased by the region of one replica controller. This makes it possible to reduce the area of the SRAM.

Furthermore, even when the replica cell groups 15-1 and 15-2 are arranged as shown in FIG. 7, the activation timings of the local sense amplifiers 12-1 and 12-2 can be optimally controlled.

Third Embodiment

In the third embodiment, first and second blocks BLK1 and BLK2 share a replica controller, and this replica controller is formed in a portion except for the portion between the first and second blocks BLK1 and BLK2.

Figure 8:
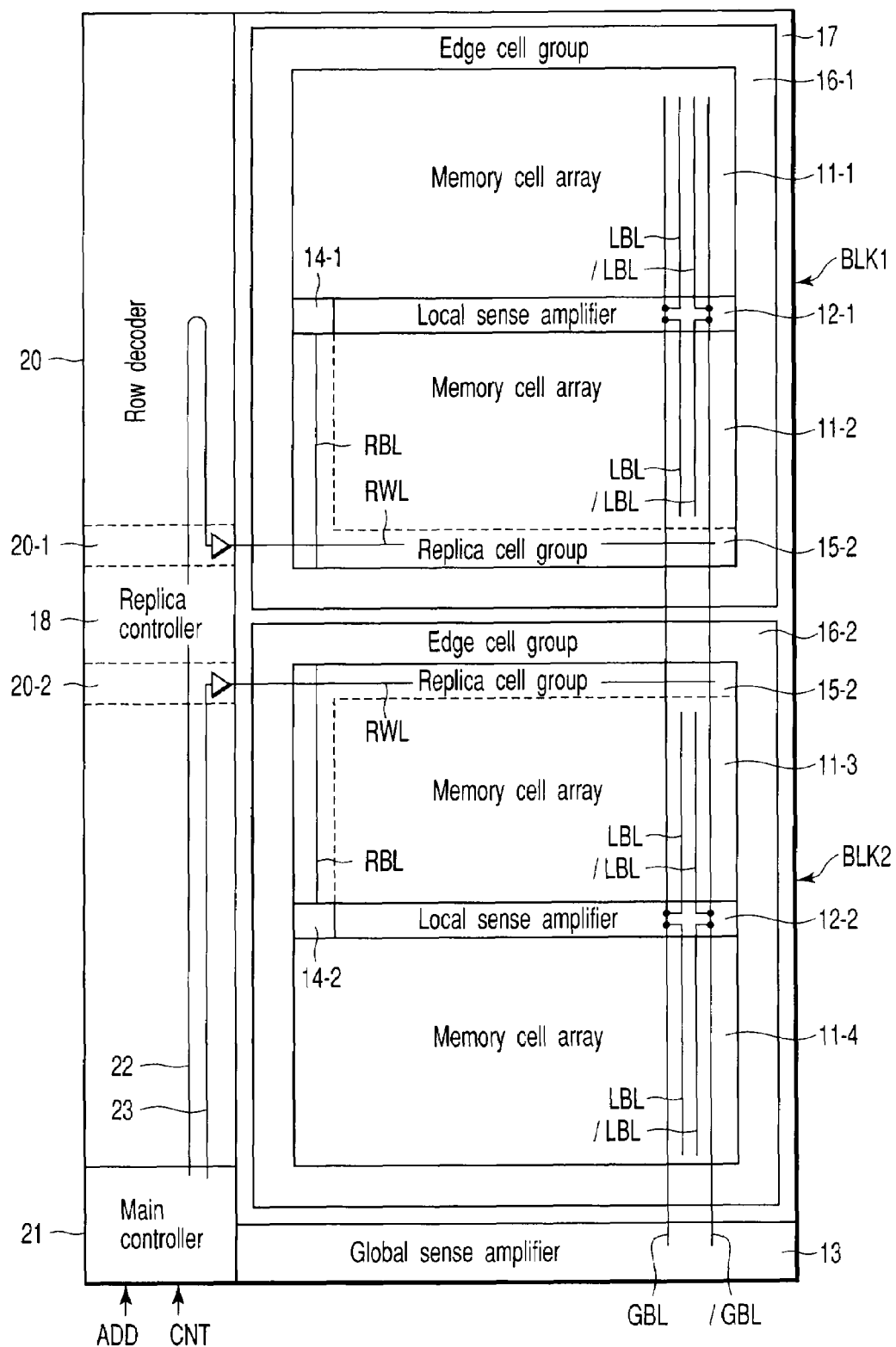
FIG. 8 is a block diagram illustrating the arrangement of an SRAM according to the third embodiment of the present invention.

FIG. 8 is a block diagram illustrating the arrangement of an SRAM according to the third embodiment of the present invention. The arrangement of the first and second blocks BLK1 and BLK2 is the same as that of the second embodiment. A well contact region 17 is formed around the first and second blocks BLK1 and BLK2. Also, a row of a well contact region 17 is formed between the first and second blocks BLK1 and BLK2.

In this embodiment, a replica controller 18 is formed in a portion except for the portion between the first and second blocks BLK1 and BLK2. More specifically, the replica controller 18 is formed in a region where a row decoder 20 is formed. Replica cell groups 15-1 and 15-2 share the replica controller 18. The replica controller 18 controls the number of replica cells RC1 to be connected to a replica bit line RBL in each of the replica cell groups 15-1 and 15-2.

In the SRAM configured as above, the upper and lower replica cell groups 15-1 and 15-2 share one replica controller although the conventional SRAM requires two replica controllers. This makes it possible to reduce one replica controller.

Also, compared to an SRAM having the conventional hierarchical structure, the length in the column direction of the SRAM can be decreased by the region of one replica controller and one row of the well contact region. This makes it possible to reduce the area of the SRAM.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
a first block and a second block adjacent to each other in a column direction, each block including a first memory cell array and a second memory cell array adjacent to each other in the column direction, and each including a plurality of memory cells arranged in a matrix, a plurality of local bit lines provided in each memory cell array, and configured to select a column of the memory cell array, and a local sense amplifier shared by the first memory cell array and the second memory cell array, and configured to sense data transferred from a memory cell to a local bit line;
a plurality of global bit lines shared by the first block and the second block, and configured to receive data transferred from the local sense amplifier;
a global sense amplifier adjacent to the second block in the column direction, and configured to sense data transferred to the global bit lines;
a first replica cell group and a second replica cell group respectively provided in the first block and the second block, and each including a plurality of replica cells;
a first replica bit line and a second replica bit line respectively connected to the first replica cell group and the second replica cell group;
an activation circuit connected to each replica bit line, and configured to activate the local sense amplifier on the basis of a potential of the replica bit line;
an edge cell group surrounding the first block and the second block, and configured to store no data; and
a contact region surrounding the edge cell group, and having contacts which supply power to a well region of transistors forming the memory cells.

2. The device according to claim 1, wherein the first block and the second block are adjacent to each other with a local bit line separation region.

3. The device according to claim 1, wherein the first block and the second block are adjacent to each other without sandwiching the edge cell group.

4. The device according to claim 1, wherein
the first replica cell group is located at an end of a memory cell array, which is farthest from the global sense amplifier, and
the second replica cell group is located at an end of a memory cell array, which is closest to the global sense amplifier.

5. The device according to claim 4, further comprising:
a first replica controller adjacent to the first replica cell group in the column direction, and configured to control the number of replica cells to be connected to the first replica bit line, and
a second replica controller adjacent to the second replica cell group in the column direction, and configured to control the number of replica cells to be connected to the second replica bit line.

6. The device according to claim 4, which further comprises:
a first replica word line connected to the first replica cell group;
a first signal line which transfers a first signal which activates the first replica word line;
a second replica word line connected to the second replica cell group;
a second signal line which transfers a second signal which activates the second replica word line; and
a main controller which generates the first signal and the second signal, and
in which a length of the second signal line is set equal to a distance to a word line connected to a memory cell included in the second block and farthest from the main controller.

7. The device according to claim 1, further comprising:
a plurality of word lines provided in the memory cell array, and configured to select a row of the memory cell array; and
a row decoder adjacent to the memory cell array in a row direction, and configured to select a word line.

8. The device according to claim 1, wherein each memory cell comprises a plurality of transistors, and is a static memory cell.

9. The device according to claim 8, wherein
the memory cell includes:
a first inverter circuit and a second inverter circuit;
a first storage node connected to an output of the first inverter circuit and an input of the second inverter circuit;
a second storage node connected to an input of the first inverter circuit and an output of the second inverter circuit; and
a transfer transistor connected between the first storage node and the local bit line, and each inverter circuit includes a load transistor and a driving transistor connected in series between a first power supply and a second power supply.

10. The device according to claim 1, wherein each replica cell stores fixed data.

11. A semiconductor memory device comprising:
a first block and a second block adjacent to each other in a column direction, each block including a first memory cell array and a second memory cell array adjacent to each other in the column direction, and each including a plurality of memory cells arranged in a matrix, a plurality of local bit lines provided in each memory cell array, and configured to select a column of the memory cell array, and a local sense amplifier shared by the first memory cell array and the second memory cell array, and configured to sense data transferred from a memory cell to a local bit line;
a plurality of global bit lines shared by the first block and the second block, and configured to receive data transferred from the local sense amplifier;
a global sense amplifier adjacent to the second block in the column direction, and configured to sense data transferred to the global bit lines;
a first replica cell group and a second replica cell group respectively provided in the first block and the second block, and each including a plurality of replica cells;
a first replica bit line and a second replica bit line respectively connected to the first replica cell group and the second replica cell group;
an activation circuit connected to each replica bit line, and configured to activate the local sense amplifier on the basis of a potential of the replica bit line; and
a replica controller shared by the first replica cell group and the second replica cell group, and configured to control the number of replica cells to be connected to the replica bit line,
the first replica cell group is located at an end of the first block, which is close to the second block, and
the second replica cell group is formed at an end of the second block, which is close to the first block.

12. The device according to claim 11, wherein the replica controller is located between the first block and the second block.

13. The device according to claim 11, wherein the replica controller is adjacent to one of the first replica cell group and the second replica cell group in a row direction.

14. The device according to claim 11, which further comprises:
a first replica word line connected to the first replica cell group;
a first signal line which transfers a first signal which activates the first replica word line;
a second replica word line connected to the second replica cell group;
a second signal line which transfers a second signal which activates the second replica word line; and
a main controller which generates the first signal and the second signal, and
in which a length of the first signal line is set equal to a distance to a word line connected to a memory cell included in the first block and farthest from the main controller.

15. The device according to claim 11, further comprising a first edge cell group and a second edge cell group respectively surrounding the first block and the second block, and configured to store no data.

16. The device according to claim 15, further comprising a first contact region and a second contact region respectively surrounding the first edge cell group and the second edge cell group, and each having contacts which supply power to a well region of transistors forming the memory cells.

17. The device according to claim 11, further comprising:
a plurality of word lines provided in the memory cell array, and configured to select a row of the memory cell array; and
a row decoder adjacent to the memory cell array in a row direction, and configured to select a word line.

18. The device according to claim 11, wherein
each memory cell includes:
a first inverter circuit and a second inverter circuit;
a first storage node connected to an output of the first inverter circuit and an input of the second inverter circuit;
a second storage node connected to an input of the first inverter circuit and an output of the second inverter circuit; and
a transfer transistor connected between the first storage node and the local bit line, and
each inverter circuit includes a load transistor and a driving transistor connected in series between a first power supply and a second power supply.

19. The device according to claim 11, wherein each replica cell stores fixed data.

20. A semiconductor memory, comprising:
a first block and a second block adjacent to each other in a column direction, each block including a first memory cell array and a second memory cell array adjacent to each other in the column direction, and each including a plurality of memory cells arranged in a matrix, a plurality of local bit lines provided in each memory cell array, and configured to select a column of the memory cell array, and a local sense amplifier shared by the first memory cell array and the second memory cell array, and configured to sense data transferred from a memory cell to a local bit line;
a plurality of global bit lines shared by the first block and the second block, and configured to receive data transferred from the local sense amplifier;
a global sense amplifier adjacent to the second block in the column direction, and configured to sense data transferred to the global bit lines;
a first replica cell group and a second replica cell group respectively provided in the first block and the second block, and each including a plurality of replica cells;
a first replica bit line and a second replica bit line respectively connected to the first replica cell group and the second replica cell group;
an activation circuit connected to each replica bit line, and configured to activate the local sense amplifier on the basis of a potential of the replica bit line;
a replica controller shared by the first replica cell group and the second replica cell group, and configured to control the number of replica cells to be connected to the replica bit line; and
a first edge cell group and a second edge cell group respectively surrounding the first block and the second block, and configured to store no data.

21. The device according to claim 20, further comprising a first contact region and a second contact region respectively surrounding the first edge cell group and the second edge cell group, and each having contacts which supply power to a well region of transistors forming the memory cells.

* * * * *